(12) United States Patent
Kim

(10) Patent No.: US 7,543,201 B2
(45) Date of Patent: Jun. 2, 2009

(54) SEMICONDUCTOR DEVICES INCLUDING TEST CIRCUITS AND RELATED METHODS OF TESTING

(75) Inventor: Chul-Soo Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 343 days.

(21) Appl. No.: 11/463,965

(22) Filed: Aug. 11, 2006

(65) Prior Publication Data

US 2007/0061649 A1 Mar. 15, 2007

(30) Foreign Application Priority Data

Aug. 22, 2005 (KR) .................. 10-2005-0076986

(51) Int. Cl.
*G01R 31/28* (2006.01)
*G06F 11/00* (2006.01)
*G06F 13/42* (2006.01)
*H04L 5/00* (2006.01)

(52) U.S. Cl. .................. 714/724; 714/815; 713/401
(58) Field of Classification Search .................. None
See application file for complete search history.

(56) References Cited

U.S. PATENT DOCUMENTS

| | | | |
|---|---|---|---|
| 5,459,402 A | 10/1995 | Ueno et al. | |
| 6,058,057 A | 5/2000 | Ochiai et al. | |
| 6,259,330 B1 | 7/2001 | Arai | |
| 6,493,279 B2 * | 12/2002 | Sato et al. .................. | 365/194 |
| 6,842,033 B1 | 1/2005 | Kim et al. | |
| 7,225,379 B2 * | 5/2007 | Yonaga .................. | 714/744 |

(Continued)

FOREIGN PATENT DOCUMENTS

EP 0585086 A2 8/1993

(Continued)

OTHER PUBLICATIONS

Notice of Allowability issued for Korean Application No. 10-2005-0076986 on May 10, 2007.

*Primary Examiner*—Christine T Tu
(74) *Attorney, Agent, or Firm*—Myers Bigel Sibley & Sajovec, P.A.

(57) ABSTRACT

A semiconductor device may include a control signal generator configured to generate a test control signal in response to an externally applied test command signal. First and second transmission gates may be configured to open and close together in response to a test clock signal pulse and the test control signal. A delay circuit may be coupled between the first and second transmission gates so that the delay circuit is configured to receive a test input signal through the first transmission gate and to transmit a delayed test input signal to the second transmission gate, and the delayed test input signal may correspond to the test input signal. A latch may be coupled between the second transmission gate and an output of the semiconductor device, and the latch may be configured to latch a first logic value when a duration of the test clock signal pulse is less than a delay of the delay circuit and to latch a second logic value when a duration of the test clock signal pulse is greater than the delay of the delay circuit, and the first and second logic values be different. Related methods are also discussed.

21 Claims, 4 Drawing Sheets

U.S. PATENT DOCUMENTS

| | | | |
|---|---|---|---|
| 7,331,005 B2 * | 2/2008 | Arnold et al. | 714/731 |
| 7,369,455 B2 * | 5/2008 | Nam | 365/230.08 |
| 2005/0229051 A1 | 10/2005 | Kim et al. | |

FOREIGN PATENT DOCUMENTS

| | | |
|---|---|---|
| EP | 0585086 A3 | 8/1993 |
| JP | 06-118122 | 4/1994 |
| JP | 06-186299 | 7/1994 |
| JP | 09-329650 | 12/1997 |
| JP | 2000-183698 A | 6/2000 |
| KR | 100255850 | 2/2000 |
| KR | 100283114 B1 | 12/2000 |
| KR | 2002-0053537 A | 7/2002 |
| KR | 10-2005-0002510 A | 1/2005 |
| KR | 1020050098604 | 10/2005 |

* cited by examiner

SEMICONDUCTOR DEVICES INCLUDING TEST CIRCUITS AND RELATED METHODS OF TESTING

RELATED APPLICATION

This application claims the benefit of Korean Patent Application No. 2005-76986, filed Aug. 22, 2005, the disclosure of which is hereby incorporated herein by reference in its entirety.

FIELD OF THE INVENTION

The present invention relates to electronics, and more particularly, to semiconductor devices and related methods of testing.

BACKGROUND

In general, a semiconductor device includes a number of integrated electronic circuits, and a plurality of semiconductor devices may be fabricated on a single wafer. However, delay times of elements of the semiconductor device(s) may change over time due to variations of fabrication processes. In other words, delay times of semiconductor device elements may be longer and/or shorter than those intended by design.

Conventionally, a plurality of semiconductor devices (e.g., semiconductor memory devices) may be provided on a single wafer, and test circuits may be disposed in spaces between the semiconductor devices to measure delay times of various elements.

FIG. 1 shows construction of a test circuit of a conventional semiconductor device. Referring to FIG. 1, the test circuit includes a power supply voltage pad PA1, a ground voltage pad PA2, output pads PB1 to PBn, and first to n-th ring oscillators 10-1 to 10-n. The first to n-th ring oscillators 10-1 to 10-n include first to n-th delay circuits DL1 to DLn, respectively. In FIG. 1, each of the first to n-th delay circuits DL1 to DLn includes different elements.

A method for measuring delay times of the respective elements of the first to n-th delay circuits DL1 to DLn will now be described with reference to FIG. 1. When a power supply voltage and a ground voltage are applied from a test apparatus (not shown) to the power supply voltage pad PA1 and the ground voltage pad PA2, respectively, the first to n-th ring oscillators 10-1 to 10-n generate clock signals at the respective output pads PB1 to PBn. The test apparatus receives the clock signals from the output pads PB1 to PBn and measures cycles of the clock signals so that the test apparatus can calculate delay times of the respective elements of the first to n-th delay circuits DL1 to DLn.

A typical ring oscillator includes an odd number of inverters that are cascade-connected. For example, assuming that each of the first to n-th delay circuits DL1 to DLn includes 7 cascade-connected inverters and a designed delay time of each of the inverters is preset to 1 nsec, the total delay time of the 7 inverters should be 7 nsec and thus, the cycle of each of the clock signals should be 14 nsec. If each of the clock signals output through the output pads PB1 to PBn has a cycle of 15 nsec, it can be determined that each of the inverters has a cycle of 15/14 nsec that is greater than the designed delay time (i.e., 1 nsec).

Because the conventional test circuit is disposed in the space between the semiconductor devices on the wafer, however, the test circuit can be measured only in the wafer state and cannot be measured during or after a packaging process.

SUMMARY

According to some embodiments of the present invention, a semiconductor device may include a control signal generator configured to generate a test control signal in response to an externally applied test command signal. First and second transmission gates may be configured to open and close together in response to a test clock signal pulse and the test control signal. A delay circuit may be coupled between the first and second transmission gates so that the delay circuit is configured to receive a test input signal through the first transmission gate and to transmit a delayed test input signal to the second transmission gate, and the delayed test input signal may correspond to the test input signal. A latch may be coupled between the second transmission gate and an output of the semiconductor device to latch an output signal of the second transmission gate, and the latch may be reset to the first logic value before generating the test control signal, and the latch may maintain the first logic level when a duration of the test clock signal pulse is less than a delay of the delay circuit, and the latch may switch to the second logic value when the duration of the test clock signal pulse is greater than the delay of the delay circuit, and the first and second logic values may be different.

According to some other embodiments of the present invention, methods of operating a semiconductor device may include generating a test control signal in response to an externally applied test command signal, and opening and closing first and second transmission gates together in response to a test clock signal pulse and the test control signal. A test input signal may be received through the first transmission gate at a delay circuit coupled between the first and second transmission gates, and the test input signal may be transmitted through the delay circuit to generate a delayed test input signal corresponding to the test input signal. When a duration of the test clock signal pulse is less than a delay of the delay circuit, a first logic value may be latched, and when a duration of the test clock signal pulse is greater than a delay of the delay circuit, a second logic value may be latched, and the first and second logic values may be different.

According to embodiments of the present invention, semiconductor devices may be provided that allow measurement of delay times of elements in a wafer state and also in a package state. According to other embodiments of the present invention, methods for testing semiconductor devices may also be provided.

According to some embodiments of, the present invention, a semiconductor device may include a control signal generator configured to generate test control signals and a test enable signal in response to an externally applied command signal and an externally applied code signal. At least one delay unit may be configured to generate an internal clock signal in response to an external clock signal and one of the test control signals. The at least one delay unit may be further configured to receive a test input signal in response to a first level of the internal clock signal to delay the test input signal, to generate the delayed test input signal, and to transmit the delayed test input signal to a common output node in response to the first level of the internal clock signal.

The semiconductor device may further include a first switch configured to select an externally applied input signal as a normal input signal during a normal operation and to select the externally applied input signal as the test input signal during a test operation, in response to the test enable signal. A second switch may be configured to select a normal output signal as an output signal during normal operation and to select a signal output from the common output node as the output signal during the test operation, in response to the test enable signal. The semiconductor device may further include a latch configured to latch the signal output from the common output node and to transmit the latched signal to the second switch. A reset transistor may be configured to reset the signal output from the common output node in response to the test enable signal. The delay unit may include a plurality of cascade-connected elements with the same delay time.

The at least one delay unit may include a logic gate configured to perform a logic operation on the external clock signal and one of the test control signals and to generate the internal clock signal. A first transmission gate may be configured to transmit the test input signal in response to the level of the internal clock signal. A delayer may be configured to delay the transmitted test input signal and to generate the delayed test input signal. A second transmission gate may be configured to transmit the delayed test input signal to the common output node in response to the first level of the internal clock signal.

The control signal generator may include a command decoder configured to decode the common signal and to generate a mode setting signal. A mode setting circuit may be configured to receive the code signal in response to the mode setting signal and to generate the test control signals. A logic gate may be configured to perform a logic OR operation on the test control signals and to generate the test enable signal.

According to some other embodiments of the present invention, a method for testing a semiconductor devices may include decoding an externally applied command signal to generate a mode setting signal, receiving an externally applied code signal in response to the mode setting signal to generate test control signals, and generating a test enable signal in response to the test control signals. An external clock signal may be received in response to one of the test control signals to generate an internal clock signal. A test input signal may be received in response to a first level of the internal clock signal and the test input signal may be delayed using a delay unit to generate a delayed test input signal. The delayed test input signal may be transmitted as an output signal in response to the same level as the first level of the internal clock signal. The external clock signal may be applied while changing the external clock signal in order to change a time point at which the internal clock signal makes a transition from the first level to a second level until an abnormal signal is output as the output signal. The second level may be different from the first level. The same level as the first level of the internal clock signal may be maintained longer than a preset delay time of the delay unit.

According to still other embodiments of the present invention, a method for testing a semiconductor device may include decoding an externally applied common signal to generate a mode setting signal, receiving an externally applied code signal in response to the mode setting signal to generate test control signals, and generating a test enable signal in response to the test control signals. An external clock signal may be received in response to one of the test control signals to generate an internal clock signal. A test input signal may be received in response to a first level of the internal clock signal, the test input signal may be delayed using a delay unit to generate the delayed test input signal, and the delayed test input signal may be transmitted as an output signal in response to the same level as the first level of the internal clock signal. The external clock signal may be applied to the semiconductor device while changing the external clock signal to change a time point at which the internal clock signal makes a transition from the first level to a second level until a normal signal is output as the output signal, and the second level may be different from the first level.

Generating the output signal may include transmitting the test input signal in response to the first level of the internal clock signal. The test input signal may be delayed to generate the delayed test input signal. The delayed test input signal may be transmitted as the output signal in response to the same level of the first level of the internal clock signal.

BRIEF DESCRIPTION OF THE DRAWINGS

The foregoing and other objects, features and advantages of the invention will be apparent from description of embodiments of the invention, as illustrated in the accompanying drawings. The drawings are not necessarily to scale, emphasis instead being placed upon illustrating principles of the invention.

DETAILED DESCRIPTION

Figure 1:
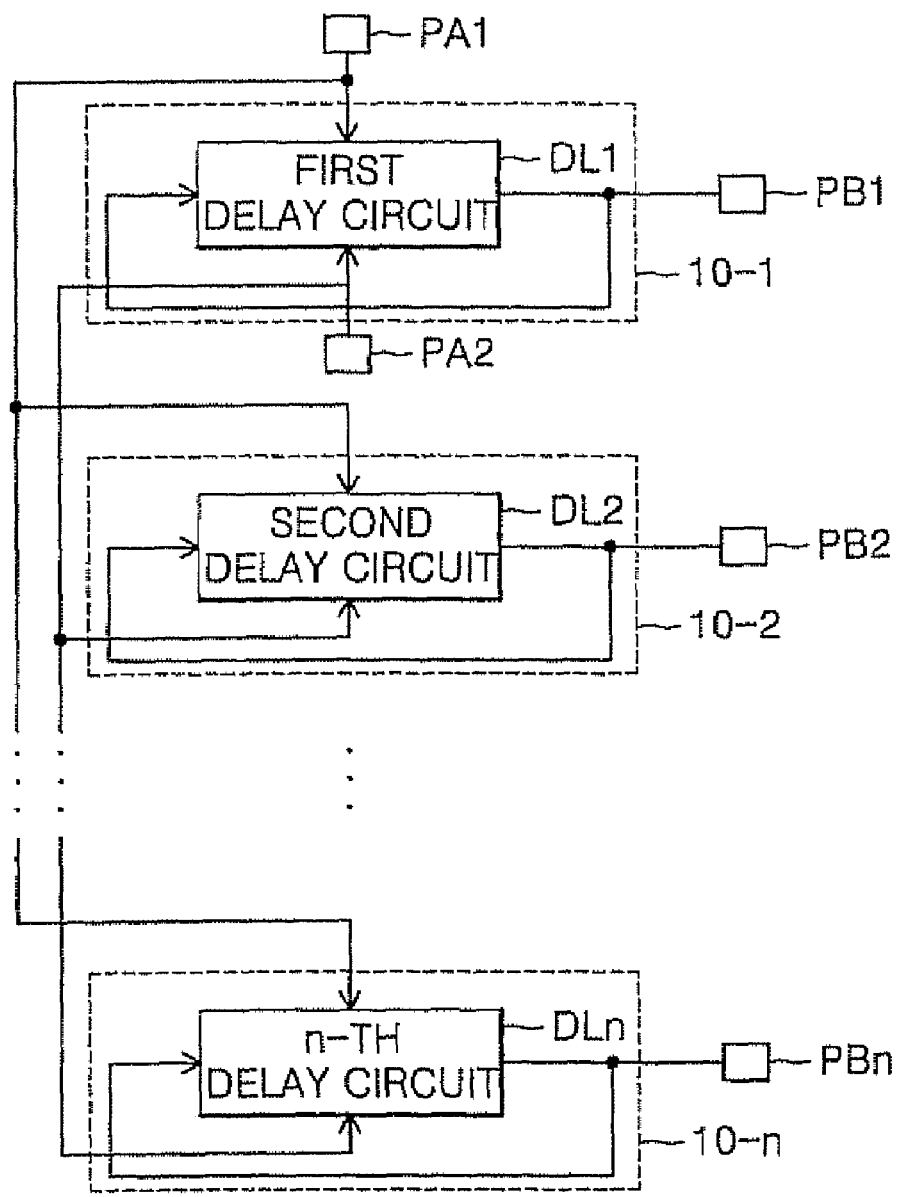
FIG. 1 is a block diagram illustrating construction of a test circuit of a conventional semiconductor device.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
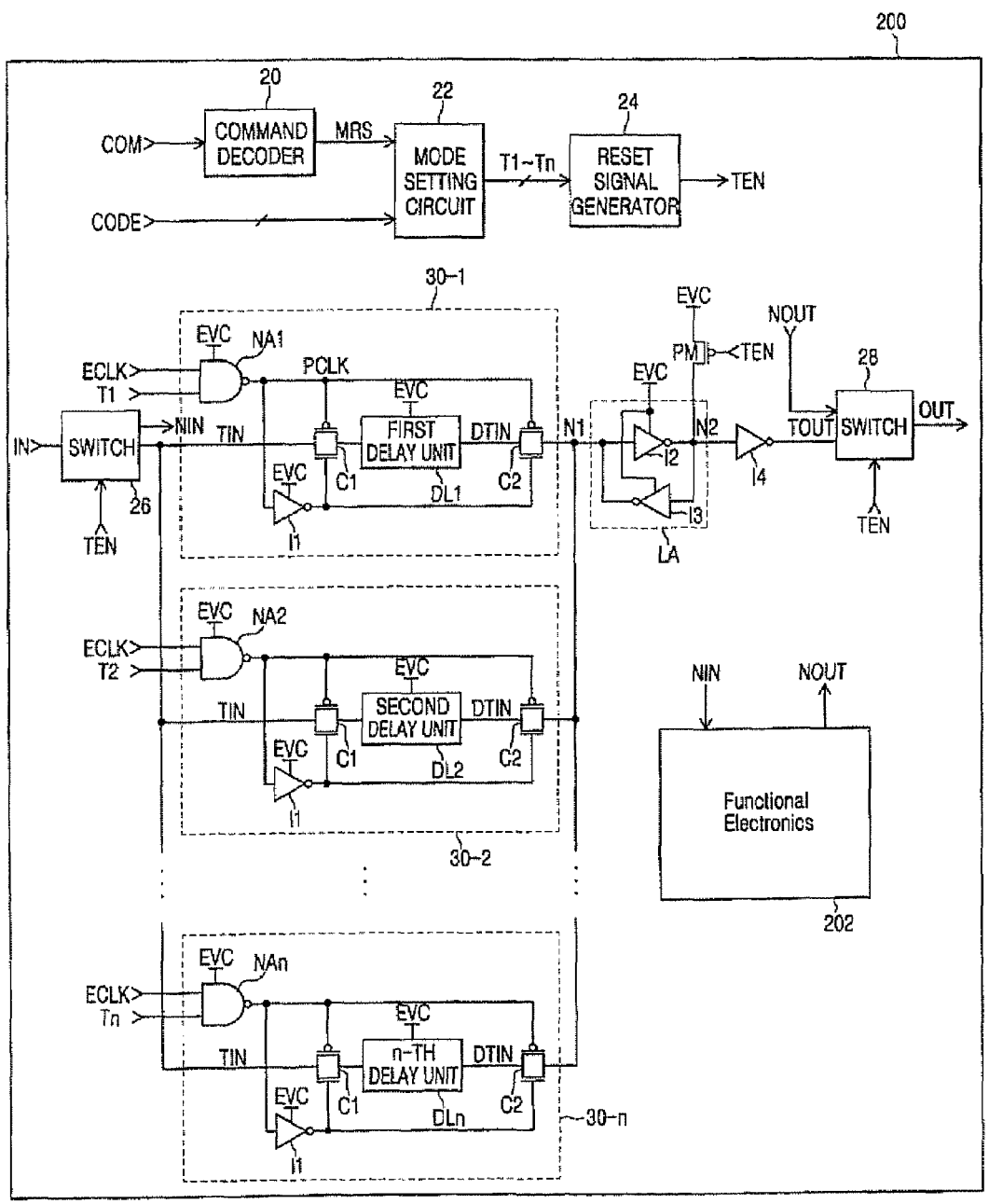
FIG. 2 is a block diagram illustrating a semiconductor device according to embodiments of the present invention.

FIG. 2 illustrates construction of a semiconductor device 200 (such as a semiconductor memory device) including test circuitry according to embodiments of the present invention. Referring to FIG. 2, the test circuitry includes a command decoder 20, a mode setting circuit 22, a reset signal generator 24, first and second switches 26 and 28, a latch LA, an inverter I4, a PMOS transistor PM, and first to n-th delay circuits 30-1 to 30-n. The command decoder 20, the mode setting circuit 22, and the reset signal generator 24 may together define a control signal generator. The semiconductor device 200 may also include functional electronics 202, such as memory electronics including a memory cell array(s). Accordingly, the semiconductor device 200 may be a semiconductor memory device. The latch LA includes inverters 12 and 13, and each of the first to n-th delay circuits 30-1 to 30-n includes CMOS transmission gates C1 and C2 and an inverter I1. In addition, each of the first to n-th delay circuits 30-1 to 30-n includes first to n-th NAND gates NA1 to NAn and first to n-th delay units DL1 to DLn, respectively. The first to n-th delay units DL1 to DLn are composed of different delay elements from one another.

An external power supply voltage EVC is applied as a power supply voltage to the first to n-th delay circuits 30-1 to 30-n shown in FIG. 2. Functions of the respective components shown in FIG. 2 will now be described.

The command decoder 20 receives an external command signal COM, decodes the command signal COM, and generates a mode setting signal MRS. The mode setting circuit 22 receives an external code signal CODE in response to the mode setting signal MRS, decodes the code signal CODE, and generates test control signals T1 to Tn. The reset signal generator 24 performs a logic OR operation on the test control signals T1 to Tn and generates a test enable signal TEN.

The first switch 26 receives an external input signal IN through an input/output pad and generates a normal input signal NIN when the test enable signal TEN is disabled during a normal operation. More particularly, the first switch may couple a normal input signal NIN from the input pad to functional electronics 202 (such as a memory cell array) during normal operations. The first switch 26 generates the test input signal TIN when the test enable signal TEN is enabled during a test operation responsive to a test input signal applied to the input/output pad. The second switch 28 provides an internally received normal output signal NOUT as an output signal OUT when the test enable signal TEN is disabled during normal operations, and provides a test output signal TOUT as the output signal OUT when the test enable signal TEN is enabled. More particularly, the second switch 28 may couple a normal output signal NOUT from the functional electronics 202 (such as a memory cell array) to the output pad during normal operations. Two pads (or pins) used by the first and second switches 26 and 28 during normal operations can also be used during the test operation. Accordingly, the test circuit need not include additional pads (or pins) to perform test operations.

The PMOS transistor PM is turned on and transmits the external power supply voltage EVC to a node N2 when the test enable signal TEN is disabled during normal operations, and is turned off when the test enable signal TEN is enabled during test operations. The latch LA and the inverter I4 latch a signal of a node N1 and generate the test output signal TOUT. Since the node N1 is at a high level during the normal operations, the test output signal TOUT is generated at a low level.

During test operations, the NAND gate NA1 of the first delay circuit 30-1 inverts an external clock signal ECLK in response to the test control signal T1 of a high level and generates a clock signal PCLK. Thus, the CMOS transmission gates C1 and C2 are turned on in response to the clock signal PCLK of a low level and turned off in response to the clock signal PCLK of a high level. During the normal operations, the NAND gate NA1 generates the clock signal PCLK of a high level in response to the test control signal T1 of a low level. Thus both the CMOS transmission gates C1 and C2 are turned off.

The first delay unit DL1 receives the test input signal TIN, delays the test input signal TIN, and generates a delayed test input signal DTIN when the CMOS transmission gate C1 is turned on, and transmits the delayed test input signal DTIN to the node N1 when the CMOS transmission gate C2 is turned on. If a high-level period of the external clock signal ECLK is shorter than a delay time of the first delay unit DL1, however, the CMOS transmission gate C2 will be turned off before the first delay unit DL1 generates the delayed test input signal DTIN, and the delayed test input signal DTIN is not transmitted to the node N1. In other words, the delayed test input signal DTIN can be transmitted to the node N1 if the high-level period of the external clock signal ECLK is longer than the delay time of the first delay unit DL1, whereas the delayed test input signal DTIN cannot be transmitted to the node N1 if the high-level period of the external clock signal ECLK is shorter than the delay time of the first delay unit DL1. When the test operations are performed while reducing the high-level period of the external clock signal ECLK, a time interval of a high-level period of the external clock signal ECLK when a test output signal TOUT corresponding to the test input signal TIN is generated, and a next time interval of a high-level period of the external clock signal ECLK when the a test output signal TOUT remains unchanged may be used to determine a delay time of the first delay unit DL1. In the above-described method, the test control signals T2 to Tn may be sequentially enabled so that the delay times of the second to n-th delay units DL2 to DLn of the second to n-th delay circuits 30-2 to 30-N are measured in the same manner as when the delay time of the first delay unit DL1 of the first delay circuit 30-1 is measured as described above.

In FIG. 2, if the test circuit includes additional pads (or pins) for an input signal IN and an output signal OUT, the first and second switches 26 and 28 may be omitted.

Figure 3A:
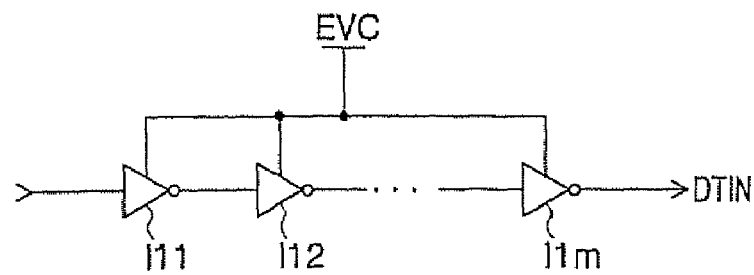
FIGS. 3A and 3B are circuit diagrams of delay units of FIG. 2.
Figure 3B:
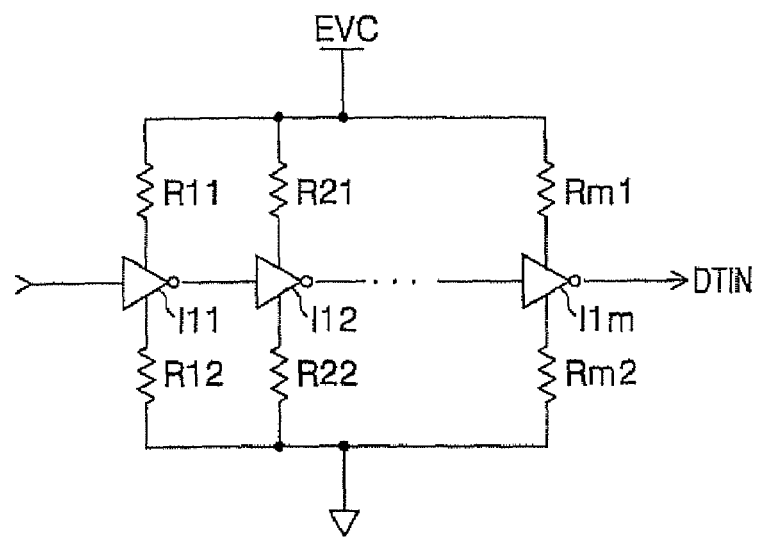

FIG. 3A is a circuit diagram of one example of a delay unit shown in FIG. 2, and FIG. 3B is a circuit diagram of another example of a delay unit shown in FIG. 2. The delay unit of FIG. 3A includes m cascade-connected inverters I11 to I1m, and the delay unit of FIG. 3B includes m cascade-connected inverters I11 to I1m, first resistors R11 to Rm1, and second resistors R12 to Rm2.

Even if two delay units have the same circuit construction as shown in FIG. 3A, if the delay units have different inventor gate oxide thicknesses, different delays may be provided. In FIG. 3B, the first resistors R11 to Rm1 are connected between an external power supply voltage EVC and first power applying terminals of the inverters I11 to I1m, respectively, and the second resistors R12 to Rm2 are connected to second power applying terminals of the inverters I11 to I1m, respectively.

In FIG. 3A, when the designed delay time of each of the m inverters I11 to I1m is td1, the delay unit should delay the test input signal TIN by m×td1 to generate the delayed test input signal DTIN. In FIG. 3B, when the designed delay time of each of the circuits (including the first resistors R11 to Rm1, the second resistors R12 to Rm2, and the inverters I11 and I1m, respectively) is td2, the delay unit should delay the test input signal TIN by m×td2 to generate the delayed test input signal DTIN.

Figure 4:
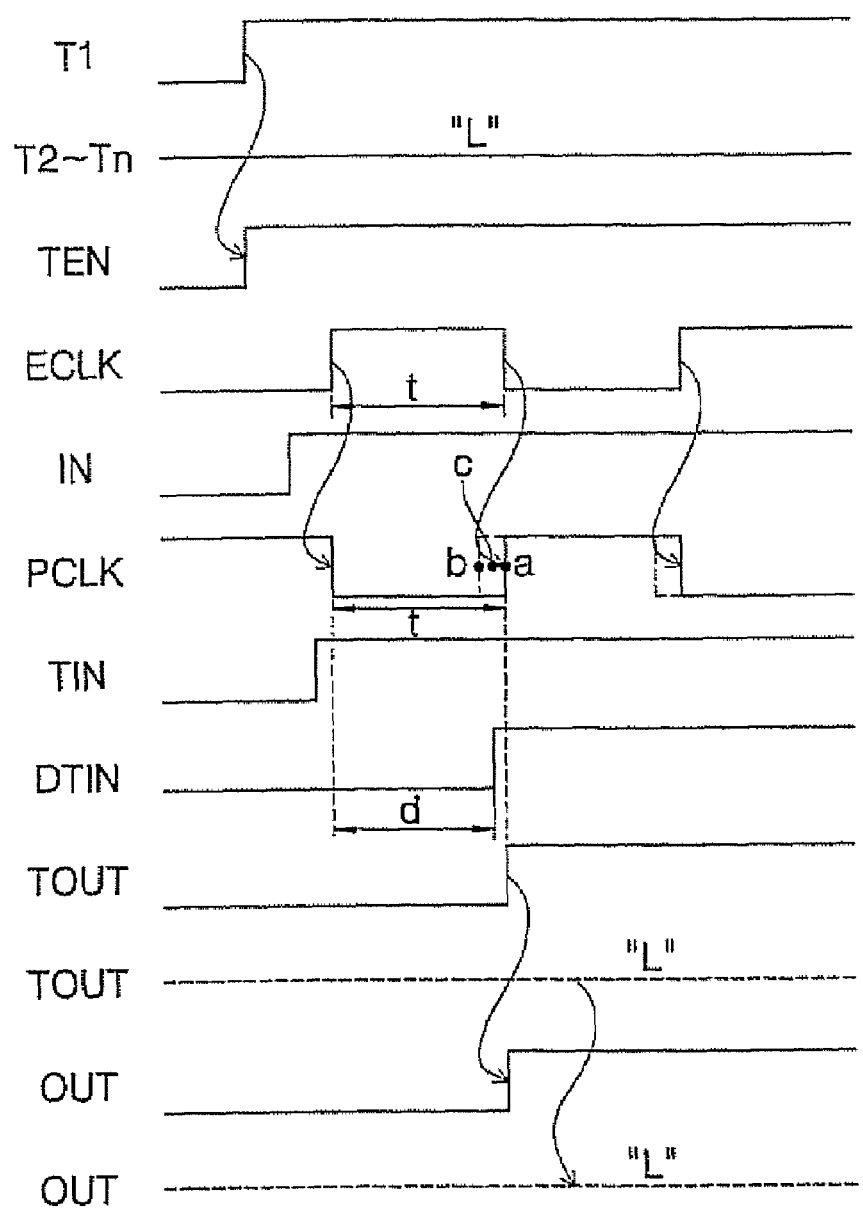
FIG. 4 is a timing diagram illustrating operations of testing the semiconductor device of FIG. 2.

FIG. 4 is a timing diagram illustrating operations of testing the semiconductor device shown in FIG. 2, specifically, when the test control signal T1 is enabled and the test control signals T2 to Tn are disabled. Before the test control signal T1 is enabled, the reset signal generator 24 of FIG. 2 generates the test enable signal TEN at a low level. Thus, the node N2 is raised to a high level, and the latch LA latches the high-level signal, and the inverter I4 inverts the signal to provide the test output signal TOUT at a low level.

When the test control signal T1 is enabled, the reset signal generator 24 of FIG. 2 generates the test enable signal TEN at a high level. Thus, the first switch 26 provides the input signal IN as the test input signal TIN, and the second switch 28 provides the test output signal TOUT as the output signal OUT. Also, the PMOS transistor PM is turned off. The test operation is thus enabled. In this state, the input signal IN and the external clock signal ECLK are sequentially applied at a high level, so that the test input signal TIN of a high level is generated. Then, when the CMOS transmission gate C1 is turned on in response to the clock signal PCLK of a low level, the test input signal TIN of a high level is transmitted. As a result, the first delay unit DL1 delays the test input signal TIN by a delay time "d" and generates the delayed test input signal DTIN of a high level. In this case, if the CMOS transmission gate C2 remains turned on, the high-level delayed test input signal DTIN is transmitted to the node N1. Also, the latch LA and the inverter I4 latch the high-level delayed test input signal DTIN and generate the test output signal TOUT of a high level and the second switch 28 generates the high-level test output signal TOUT as the output signal OUT.

Thereafter, while moving a high-level period "t" of the external clock signal ECLK from a time point "a" to a time point "c" (namely, while moving up a time point at which the external clock signal ECLK makes a downward transition), the test operation is carried out. If the first delay unit DL1 generates a test input signal DTIN that is delayed by the delay time "d" from the time point at which a clock signal PCLK makes the downward transition as shown in FIG. 4, the high-level test output signal TOUT is generated before the time point at which the external clock signal ECLK making the downward transition reaches the time point "c" and thus, the output signal OUT of a high level is generated through the second switch 28. On the other hand, if the time point at which the external clock signal ECLK makes the downward transition moves from the time point "c" to a time point "b" to make a high-level period shorter, the test output signal TOUT of a low level is generated as shown with a dotted line and thus, the output signal OUT of a low level is generated through the second switch 28 as shown with a dotted line.

Therefore, while lessening the high-level period of the external clock signal ECLK, the test apparatus calculates, as a delay time of the first delay unit 30-1, the average of the high-level period of the external clock signal ECLK applied when the low-level output signal OUT is first generated and the high-level period of the external clock signal ECLK applied when the high-level output signal OUT is finally generated. Then, the test apparatus divides the calculated delay time by m so as to obtain the delay times of the respective inverters or elements of the first delay unit.

In the above-described method, not only the delay times of the second to n-th delay units DL2 to DLn but also the delay times of the respective inverters or elements can be measured.

In embodiments discussed above, a high-level period of the external clock signal ECLK is initially longer than the designed delay time of the delay unit and the test operation is performed while lessening the high-level period of the external clock signal ECLK until an abnormal output signal OUT is generated. In an alternative, the high-level period of the external clock signal ECLK may be initially shorter than the designed delay time of the delay unit and the test operation may be performed while increasing the high-level period of the external clock signal ECLK until a normal output signal OUT is generated. In other words, when the test operation is performed while lessening the high-level period of the external clock signal ECLK, a time interval between a high-level period of the external clock signal ECLK in the case where the same test output signal TOUT as the test input signal TIN is finally generated and a high-level period of the external clock signal ECLK in the case where the same test output signal TOUT as the test input signal TIN is not first generated becomes the delay time of the first delay unit DL1.

As discussed above, semiconductor devices and methods for testing the same according to embodiments of the present invention can measure delay times of elements in a wafer state and also in a package state.

Further, devices and methods according to embodiments of the present invention can measure the delay times of respective elements in a more precise manner using an external clock signal.

Embodiments of the present invention have been disclosed herein and, although specific terms are employed, they are used and are to be interpreted in a generic and descriptive sense only and not for purpose of limitation. Accordingly, it will be understood that various changes in form and details may be made without departing from the spirit and scope of the present invention as set forth in the following claims.

What is claimed is:

1. A semiconductor device comprising:
    a control signal generator generating test control signals and a test enable signal in response to an externally applied command signal and an externally applied code signal; and
    at least one delay unit generating an internal clock signal in response to an external clock signal and one of the test control signals, receiving a test input signal in response to a first level of the internal clock signal, delaying the test input signal, generating the delayed test input signal, and transmitting the delayed test input signal to a common output node in response to the first level of the internal clock signal.

2. The semiconductor device according to claim 1, further comprising:
    a first switch selecting an externally applied input signal as a normal input signal during a normal operation and selecting the externally applied input signal as the test input signal during a test operation in response to the test enable signal; and
    a second switch selecting a normal output signal as an output signal during the normal operation and selecting a signal output from the common output node as the output signal during the test operation in response to the test enable signal.

3. The semiconductor device according to claim 2, further comprising:
a latch latching the signal output from the common output node and transmitting the latched signal to the second switch; and
a reset transistor resetting the signal output from the common output node in response to the test enable signal.

4. The semiconductor device according to claim 1, wherein the at least one delay unit comprises:
a logic gate performing a logic operation on the external clock signal and one of the test control signals and generating the internal clock signal;
a first transmission gate transmitting the test input signal in response to the level of the internal clock signal;
a delayer delaying the transmitted test input signal and generating the delayed test input signal; and
a second transmission gate transmitting the delayed test input signal to the common output node in response to the first level of the internal clock signal.

5. The semiconductor device according to claim 4, wherein the control signal generator comprises:
a command decoder decoding the common signal and generating a mode setting signal;
a mode setting circuit receiving the code signal in response to the mode setting signal and generating the test control signals; and
a logic gate performing a logic OR operation on the test control signals and generating the test enable signal.

6. The semiconductor device according to claim 4, wherein the delay unit comprises a plurality of cascade-connected elements with the same delay time.

7. The semiconductor device according to claim 6, wherein the elements are inverters.

8. A semiconductor device comprising:
a control signal generator configured to generate a test control signal in response to an externally applied test command signal;
first and second transmission gates configured to open and close together in response to a test clock signal pulse and the test control signal;
a delay circuit coupled between the first and second transmission gates so that the delay circuit is configured to receive a test input signal through the first transmission gate and to transmit a delayed test input signal to the second transmission gate wherein the delayed test input signal corresponds to the test input signal; and
a latch coupled between the second transmission gate and an output of the semiconductor device to latch an output signal of the second transmission gate, wherein the latch is reset to the first logic value before generating the test control signal, and wherein the latch maintains the first logic value when a duration of the test clock signal pulse is less than a delay of the delay circuit, and wherein the latch switches to the second logic value when the duration of the test clock signal pulse is greater than the delay of the delay circuit, and wherein the first and second logic values are different.

9. A semiconductor device according to claim 8 wherein the latch is reset to the second logic value before generating the test control signal, wherein the latch maintains the second logic value when a duration of the test clock signal pulse is greater than a delay of the delay circuit, and wherein the latch switches to the first logic value when the duration of the test clock signal pulse is less than the delay of the delay circuit.

10. A semiconductor device according to claim 8 wherein the test clock signal pulse comprises a logic high test clock signal pulse so that the first and second transmission gates open responsive to a rising edge of the test clock signal pulse and close responsive to a falling edge of the test clock signal pulse.

11. A semiconductor device according to claim 8 wherein the test clock signal pulse comprises a logic low test clock signal pulse so that the first and second transmission gates open responsive to a falling edge of the test clock signal pulse and close responsive to a rising edge of the test clock signal pulse.

12. A semiconductor device according to claim 8 further comprising:
an input switch coupled between the first transmission gate and an input/output pad of the semiconductor device, wherein the input switch is configured to couple the test input signal from the input/output pad to the first transmission gate responsive to the test control signal, and wherein the input switch is configured to couple the input/output pad to functional electronics of the semiconductor device in the absence of the test control signal.

13. A semiconductor device according to claim 12 wherein the functional electronics of the semiconductor device comprise a memory cell array.

14. A semiconductor device according to claim 8 further comprising:
an output switch coupled between the latch and an input/output pad of the semiconductor device, wherein the output switch is configured to couple an output of the latch to the input/output pad responsive to the test control signal, and wherein the output switch is configured to couple the input/output pad to functional electronics of the semiconductor device in the absence of the test control signal.

15. A semiconductor device according to claim 14 wherein the functional electronics of the semiconductor device comprise a memory cell array.

16. A semiconductor device according to claim 8 wherein the delay circuit comprises a first delay circuit, wherein the test control signal comprises a first test control signal, wherein the control signal generator is configured to generate the first test control signal in response to the externally applied test command signal and to a first code signal, and wherein the control signal generator is configured to generate a second test control signal in response to the externally applied test command signal and to a second code signal, the semiconductor device further comprising:
third and fourth transmission gates configured to open and close together in response to a test clock signal pulse and the second test control signal; and
a second delay circuit coupled between the third and fourth transmission gates so that the second delay circuit is configured to receive a second test input signal through the third transmission gate and to transmit a second delayed test input signal to the fourth transmission gate wherein the second delayed test input signal corresponds to the second test input signal;
wherein the latch is coupled between the fourth transmission gate and the output of the semiconductor device, wherein the latch is configured to latch the first logic value when a duration of the test clock signal pulse is less than a delay of the second delay circuit and to latch the second logic value when a duration of the test clock signal pulse is greater than the delay of the second delay circuit.

17. A semiconductor device according to claim 8 wherein the control signal generator is further configured to generate a memory read/write control signal responsive to an externally applied read/write command signal, the semiconductor device further comprising:
- a memory cell array configured to perform a memory read/write operation responsive to the memory read/write control signal.

18. A method for testing a semiconductor device, comprising:
- a) decoding an externally applied command signal to generate a mode setting signal, receiving an externally applied code signal in response to the mode setting signal to generate test control signals, and generating a test enable signal in response to the test control signals;
- b) receiving an external clock signal in response to one of the test control signals to generate an internal clock signal; and
- c) receiving a test input signal in response to a first level of the internal clock signal and delaying the test input signal using a delay unit to generate a delayed test input signal, and transmitting the delayed test input signal as an output signal in response to the first level of the internal clock signal,
- wherein the external clock signal is applied to the semiconductor device while changing the external clock signal in order to change a time point at which the internal clock signal makes a transition from the first level to a second level until an abnormal signal is output as the output signal, the second level being different from the first level.

19. The method according to claim 18, wherein the same level as the first level of the internal clock signal is maintained longer than a preset delay time of the delay unit.

20. A method for testing a semiconductor device, comprising:
- a) decoding an externally applied common signal to generate a mode setting signal, receiving an externally applied code signal in response to the mode setting signal to generate test control signals, and generating a test enable signal in response to the test control signals;
- b) receiving an external clock signal in response to one of the test control signals to generate an internal clock signal; and
- c) receiving a test input signal in response to a first level of the internal clock signal and delaying the test input signal using a delay unit to generate the delayed test input signal, and transmitting the delayed test input signal as an output signal in response to the first level of the internal clock signal,
- wherein the external clock signal is applied to the semiconductor device while changing the external clock signal in order to change a time point at which the internal clock signal makes a transition from the first level to a second level until a normal signal is output as the output signal, the second level being different from the first level.

21. The method according to claim 20, wherein the first level of the internal clock signal is maintained shorter than a preset delay time of the delay unit.

* * * * *